United States Patent [19]

Weitze et al.

[11] 4,039,721
[45] Aug. 2, 1977

[54] THICK-LAYER CONDUCTOR PATH PASTES

[75] Inventors: Artur Weitze; Peter Leskovar, both of Munich, Germany

[73] Assignee: Siemens Aktiengesellschaft, Berlin & Munich, Germany

[21] Appl. No.: 611,793

[22] Filed: Sept. 9, 1975

[30] Foreign Application Priority Data

Sept. 18, 1974 Germany .............................. 2444639

[51] Int. Cl.² .......................... B32B 17/06; H01B 1/02
[52] U.S. Cl. .................................... 428/426; 252/512; 252/514; 427/123; 427/125; 427/380; 427/383 B; 428/457

[58] Field of Search ................ 252/512, 514; 427/123, 427/125, 383 B, 380; 428/426, 457

[56] References Cited

U.S. PATENT DOCUMENTS 3,547,835  12/1970  Short ................................... 252/514
3,808,046  4/1974  Davey ................................. 252/514

Primary Examiner—Cameron K. Weiffenbach
Attorney, Agent, or Firm—Hill, Gross, Simpson, Van Santen, Steadman, Chiara & Simpson

[57] ABSTRACT

A thick-layer conductor path paste consisting of a suspension of a powder mixture containing metals and fritted glass in an organic carrier medium. Also, methods for making conductor paths and the paths so made.

8 Claims, 2 Drawing Figures

THICK-LAYER CONDUCTOR PATH PASTES

BACKGROUND OF THE INVENTION

Thick-layer conductor path pastes containing powdered metal and fritted glass are generally known to the art. A common feature of such pastes is that they contain in powdered form conductive metals, such as silver or palladium. For the production of conductor paths in hybrid circuits and the like, such thick layer conductor path pastes are applied to a glass- or ceramic (vitreous) carrier substrate by some known technique, for example, by the silk-screen printing technique, followed by drying, and then subjecting to a baking process. In addition to conductor paths, printed circuit components, such as resistors, capacitors, or the like, can also be formed on the glass- or ceramic carrier using such a paste. Furthermore, by interposing appropriate insulating planes, one can construct, using such a paste, circuit carriers with a plurality of conductor path planes.

The known thick-layer conductor path pastes unfortunately characteristically possess a strong tendency to diffusion, so that specific components thereof penetrate into adjacent layers in a circuit construction. If conductive components of the thick-layer conductor path pastes diffuse either into the dielectric layers of capacitors, or into the insulating planes of multi-layer circuit carriers, the danger exists that short-circuits will occur. Micro-pores and fine cracks in the insulating layers substantially increase this danger. The formation of diffusion zones between thick layer conductor paths and printed resistors is also undesirable because such zones cause resistances value to alter and greatly impedes an accurate calculation of resistances.

BRIEF SUMMARY OF THE INVENTION

The present invention provides a thick-layer conductor path paste which possesses only a slight tendency to diffuse and which aims to provide an improved paste composition which overcomes the disadvantages of the prior art.

More particularly, by the present invention, there is provided in one aspect a thick-layer conductor path paste composition adapted for forming thick layer conductor paths comprising in uniform admixture on a 100 weight percent total composition basis:
  A. from about 72 to 78 weight percent of a powder mixture which comprises on a 100 weight percent total mixture basis:
     1. from about 3 to 28 weight percent of silver particles
     2. from about 30 to 61 weight percent of aluminum particles and
     3. from about 24 to 44 weight percent of fritted glass, and
  B. from about 22 to 28 weight percent of an organic carrier liquid.

In one preferred form, in such a paste composition, at least about 95 weight percent of said powder mixture consists of about 4 weight percent silver, about 55 weight percent aluminum and about 41 weight percent fritted glass.

Preferably in such a paste composition, such silver and such aluminum each have particle sizes ranging from about 6 to 20 microns.

In another aspect, the present invention provides an improved process for forming conductor paths. Thus, to form a conductor path upon a preformed vitreous substrate surface, one follows the sequential steps of:
  1. depositing on such surface in predetermined locations a paste composition of the type provided by this invention,
  2. drying the resulting such deposits at a temperature ranging from about 20° to 120° C for a time of from about 2 to 0.2 hours, and
  3. heating the so dried deposits and at least the adjacent portions of such surface associated therewith to a temperature ranging from about 850° to 1050° C for a time of from about 0.2 to 1 hours.

In a further aspect, the present invention provides new and very useful conductor paths, such as conductor paths produced by the foregoing sequence of process steps. In general, a conductor (e.g., electrically conductive) path of this invention is associated at least in part with predetermined locations of a preformed vitreous substrate surface. Such path comprises a sintered uniform mixture initially comprised on a 100 weight percent total mixture basis of:
  a. from about 3 to 28 weight percent of silver particles,
  b. from about 30 to 61 weight percent of aluminum particles,
  c. from about 24 to 44 weight percent of fritted glass, such path having been produced by heating such initial mixture deposited on such locations to a temperature ranging from about 850° to 1050° C for a time of from about 0.2 to 1 hours.

Preferred such paths are made using preferred paste compositions and particle sizes as above indicated.

DETAILED DESCRIPTION

Figure 1:
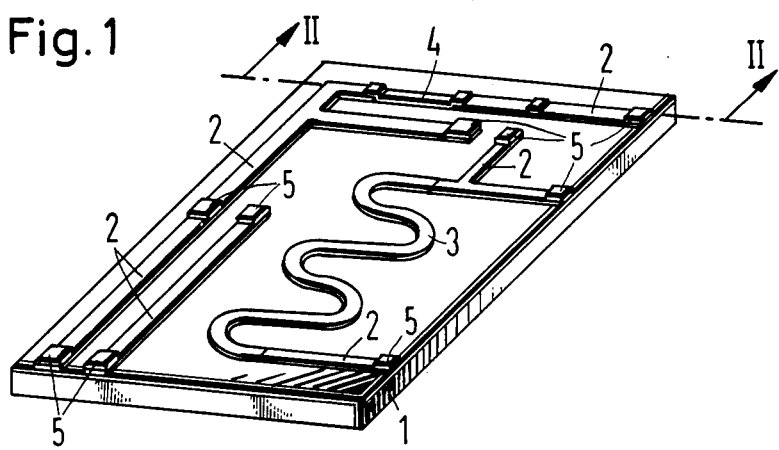
FIG. 1 is a perspective view of one embodiment of a solid-state microcircuit assembly formed on the surface of a vitreous wafer and utilizing thick layer conductor paths formed using the teaching of the present invention.

The invention involves a recognition that a thick-layer conductor path paste, whose solid components consist up to at least about 95% by weight of silver, aluminum and fritted glass, possesses a striking and unexpected low tendency towards diffusion when these solid components are utilized in specific mixture ratios.

Up to 5% by weight of the solid components in any given composition of this invention can consist of known paste additives without substantially increasing the diffusion tendency. Bismuth oxide ($Bi_2O_3$), for example, can be used as a solid additive in this invention. The bismuth oxide here acts as a flux agent, and characteristically produces improved wetting and adhesion to a base of a composition of this invention.

While known thick-layer conductor path pastes exhibit a marked tendency to diffusion, the small tendency to diffusion of a thick-layer conductor path paste of this invention is theorized to be due to the presence of aluminum and to the formation of reaction products of the aluminum with the fritted glass, but there is no intent to be bound by theory herein. The exact nature of these reaction products which are formed during the baking of the thick-layer conductor path paste is not now known. However, it is theorized that the silver acts as a catalyst causing their formation.

Although the thick-layer conductor path pastes of this invention are baked-in after application and doping at temperatures between about 850° and 1050° C, surprisingly no separation of components occurs during such baking process. As the melting point of the aluminum is about 659° C, one might expect that the aluminum would melt and become deposited in the form of small globules on surfaces bearing a deposit derived from a paste composition of this invention.

In addition to a low tendency towards diffusion, a thick-layer conduct or path pastes of this invention has further advantages in that it remains substantially no solder and is compatible with known thick-layer conductor path pastes and thick-layer resistance pastes. Thus, for example, in hybrid circuits, those points which are later to be wetted by a solder, are provided with a solderable thick-layer paste. During the tinning process in a surge-or dip path, the regions overlying paths derived from conventional pastes are wetted and coated by a solder, whereas conductor path zones produced from a conductor path paste of this invention are substantially not wetted or coated. The danger in the prior art of the formation of solder bridges between adjacent conductor paths is thus eliminated in this invention. Also, in circuits exhibiting connection surfaces for the soldering on of semiconductor modules, such as in the flip-chip technique, the pressed-on connection surfaces can be selectively coated with solder, so that uniformly shaped solder cups are formed. Thus, it is no longer necessary during chip manufacture to press on a solder-rejecting barrier which delimits the connection surfaces from the conductor paths.

Preferably the mixture ratios in a composition of this invention and in a conductive path of this invention are such that at least about 95% by weight of the powder mixture consists of about 4% by weight silver, about 55% by weight aluminum and about 41% by weight fritted glass. In such a composition the balance up to 100 weight percent if any, can be any conventional particulate material such as bismuth oxide or the like.

Besides an extremely low tendency towards diffusion, a thick-layer conductor path paste composition of this invention characteristically possesses a particularly low surface resistance.

In a preferred embodiment of the thick-layer conductor path paste in accordance with the invention, the granule (particle) sizes of the silver powder and of the aluminum powder range from about 6 to 20 microns. The lower and upper limits of the granule sizes are in this invention generally selected to be such that no undesired oxidation occurs during the baking or sintering process and the thick-layer conductor path paste is easy to process.

Preferred fritted glass used in the present invention has particle sizes ranging from about 2 to 40 microns, though fritted glass used can contain larger or smaller particles, as those skilled in the art will appreciate. More preferably, a fritted glass contains particles ranging from about 5 to 30 microns.

In general, the fritted glass used in the present invention is characterized by a capacity to sinter at temperatures ranging from about 800° to 1100° C. Any convenient glass composition with such a characteristic may be employed though a presently preferred class of glass compositions comprises borosilicate glasses.

The composition of the organic carrier liquid can vary widely, and the exact composition of such in any given paste composition of this invention is relatively unimportant. Organic fluids such as hydrocarbons, alcohols, esters, ketones, aldehydes, heterocyclics, mixtures thereof, and the like can be employed. A presently preferred such fluid comprises mixed terpineol isomers.

Also, such a fluid can have initially dissolved therein an organic additive compound which aids in improving product paste composition properties, such as viscosity, homogeneity, storage stability, and the like. One presently preferred such additive compound comprises ethyl cellulose which can be advantageously employed in amounts up to about 15 weight percent or even somewhat more (based on total organic liquid weight) in any given situation.

In general, however, the organic liquid used is vaporizable at temperatures which are not above those used to dry a given paste composition after its application to a vitreous substrate surface in forming a conductor path of this invention. Thus, this liquid should preferably be vaporizable at temperatures ranging from about 20° C to 120° C. Also, any organic residues left after the drying operation following application of a paste composition to a substrate should be substantially completely combustible to volatile by-products at temperatures used for the final sintering, or baking-in operation. Thus, ethyl cellulose is substantially completely combused without ash to water and carbon dioxide at temperatures below about 750° C in air. Thus in general, such organic residues should preferably be combustible at temperatures ranging from about 350° to 450° C.

The exact total quantity of organic carrier liquid used in any given paste composition of this invention can vary widely, depending upon conditions, components used, application procedures contemplated, and the like, so that it is not possible or practical to give a specific weight percentage of organic carrier liquid applicable to all use situations. It is preferred to have a paste composition of this invention have a viscosity in the range from about 10000 to 100000 centipoises, though larger and smaller viscosities can be employed as those skilled in the art will realize.

Paste compositions of this invention can be made by any convenient procedure using any convenient equipment. One preferred procedure involves first making or purchasing commercially a silver paste composition and then admixing therewith aluminum particles in desired amount.

Paste compositions of this invention can be used to apply conductor paths by any convenient paste application technique, though silk screening constitutes a presently preferred technique for application. The term "thick-layer" in relation to conductor paths produced by paste compositions of this invention has reference to layer thicknesses which range from about 5' to 45 microns in thickness after application to a vitreous substrate and after drying at temperatures as above taught. Thicker and thinner layer path thicknesses can sometimes advantageously be employed as those skilled in the art will readily appreciate.

EMBODIMENTS

The present invention is further illustrated by reference to the following examples. Those skilled in the art will appreciate that other and further embodiments are obvious and within the spirit and scope of this invention from the teachings of these present examples taken with the accompanying specification.

EXAMPLE 1

A first intermediate product formed in the production of a thick-layer conductor path paste of this invention is a silver paste. Thus, on a 100 weight percent total weight basis, 70% by weight silver powder with granule sizes below about 10 microns and 4.5% by weight fritted borosilicate glass powder are mixed with an organic carrier liquid. This liquid is viscous solution of 10% by weight ethylcellulose (total solution weight basis) in a mixture of terpineol isomers. The weight ratio of such silver powder to such organic carrier liquid is in the range from about 3:1 to 4:1. The intermediate product produced in this way corresponds to commercially available silver pastes.

Next, 1 part by weight of this silver paste, 10 parts by weight of aluminum powder with granule sizes ranging from about 6 to 20 microns, 5.7 parts by weight of fritted borosilicate glass powder with granule sizes ranging from about 5 to 30 microns, and 6 parts by weight of an organic carrier liquid are mixed and homogenized on a roller frame. The organic carrier liquid used here is again a solution of 10% by weight ethylcellulose (total solution weight basis) in a mixture of terpineol isomers.

Following such homogenisation, the product thick-layer conductor path paste is found to have a viscosity such that it could be directly used for silk-screen printing. With the aid of a prechosen silk-screen printing template, referring to FIG. 1 conductor paths 2 are printed on the surface of a ceramic carrier substrate 1. The so imprinted on thick-layer conductor path paste is dried at a temperature of about 100° C., and the ceramic carrier 1 is introduced into a constant temperature furnace. The sintering or baking-in is here carried out over a cycle time of about 10 minutes, the peak temperature of 1000° C being maintained for a period of about 2 minutes. During the heating cycle, the furnace is continuously flushed with air. The product conductor path on such substrate is found to have excellent conductivity characteristics.

Then, the resistors 3 and 4 are formed, as follows: A commercially available resistance paste is applied to the ceramic carrier 1, dried and baked in at a peak temperature of about 850° C. For the formation of solderable zones 5 on the conductor paths 2, a commercially available silver-palladium conductor path paste is applied, dried, and baked in at a peak temperature of about 850° C. As the conductor paths 2 and the resistors 3 and 4 do not appear to retain any solder, the solderable zones 5 can be selectively coated with solder in a conventional type solder surge- or dip bath.

Figure 2:
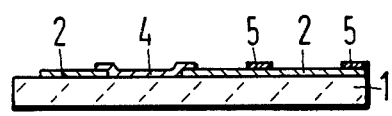
FIG. 2 is a vertical sectional view taken along the line II—II of FIG. 1.

Referring to FIG. 2, it is seen that the resistor 4 is applied to the ceramic carrier 1. The ends of the associated conductor paths 2 are overlapped and the solderable zones 5 are impressed onto the conductor paths 2. At the overlap points of the conductor paths 2 and the resistor 4, only an extremely small diffusion zone is formed, so that the form factor of the impressed resistance layer is virtually unity. This means that, with a constant thickness, the resistors 3 and 4 are merely dependent upon their respective length to-width ratios so that there respective resistance values can be calculated very precisely. A surface resistance of the conductor paths 2 with 0,03 Ohms/square corresponds approximately to the surface resistance of known silver-palladium conductor path pastes.

EXAMPLE 2

For the production of a thick-layer conductor path paste, in accordance with the present invention, 7% by weight of silver powder having granule sizes below about 10 microns 34% by weight of fritted glass powder having granule sizes below about 30 microns, 21% by weight aluminum powder having granule sizes between about 6 and 10 microns, 15.6% by weight aluminum powder with granule sizes below about 20 microns, and 22.4% by weight of the organic carrier liquid identified in Example 1 are weighed out and homogenized on a roller frame. The resulting paste composition of this invention is used by the procedure described in Example 1. to form a conductor path on a ceramic substrate. This path is found to have excellent conductive characteristics.

We claim:

1. A conductive path associated with predetermined locations of a preformed vitreous substrate surface, said path comprising a sintered uniform mixture initially comprised on a 100 weight percent total mixture basis of:
   a. from about 3 to 28 weight percent of silver particles
   b. from about 30 to 61 weight percent of aluminum particles,
   c. from about 24 to 44 weight percent of fritted glass, said path having been produced by heating such initial mixture deposited on such locations to a temperature ranging from about 850° to 1050° C for a time of from about 0.2 to 1 hours.

2. A conductive path of claim 1 wherein said powder mixture consists on a 100 weight percent total mixture basis of about 4 weight percent silver, about 55 weight percent aluminum and about 41 weight percent fritted glass.

3. A conductive path of claim 1 wherein initially said silver particles and said aluminum particles each range in size from about 6 to 20 microns.

4. A paste composition adapted for forming thick layer conductor paths comprising in uniform admixture on a 100 weight percent total composition basis:
   A. from about 72 to 78 weight percent of a powder mixture which comprises on a 100 weight percent total mixture basis:
      1. from about 3 to 28 weight percent of particles silver
      2. from about 30 to 61 weight percent of aluminum particles, and
      3. from about 24 to 44 weight percent of fritted glass, and
   B. from about 22 to 28 weight percent of an organic carrier liquid.

5. The paste composition of claim 4 wherein said silver particles and said aluminum particles each range in size from about 6 to 20 microns.

6. The composition of claim 4 wherein said fritted glass has a particle size of from about 2 to 40 microns and is a borosilicate glass.

7. A process for forming a conductor path upon a preformed vitreous substrate surface comprising the steps of:
   A. depositing on such surface in predetermined locations a paste composition of claim 4,
   B. drying the resulting such deposits at a temperature ranging from about 20° to 120° C for a time from about 0.2 to 2 hours, and
   C. heating the so dried deposits and at least the adjacent portions of such surface associated therewith to a temperature ranging from about 850° to 1050° C for a time of from about 0.2 to 1 hours.

8. A conductive path produced by the process of claim 7.

* * * * *